United States Patent
Inoue et al.

(10) Patent No.: US 8,430,978 B2
(45) Date of Patent: Apr. 30, 2013

(54) SPUTTERING TARGET AND METHOD FOR PRODUCTION THEREOF

(75) Inventors: Akihisa Inoue, Miyagi (JP); Hisamichi Kimura, Miyagi (JP); Kenichiro Sasamori, Miyagi (JP); Masataka Yahagi, Ibaraki (JP); Atsushi Nakamura, Ibaraki (JP); Hideyuki Takahashi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 10/566,116

(22) PCT Filed: Jul. 14, 2004

(86) PCT No.: PCT/JP2004/010361
§ 371 (c)(1),
(2), (4) Date: Jan. 24, 2006

(87) PCT Pub. No.: WO2005/012591
PCT Pub. Date: Feb. 10, 2005

(65) Prior Publication Data
US 2006/0185771 A1    Aug. 24, 2006

(30) Foreign Application Priority Data
Aug. 5, 2003  (JP) ................................. 2003-286876

(51) Int. Cl.
C22C 45/00    (2006.01)
(52) U.S. Cl.
USPC ........................................... 148/403; 75/246
(58) Field of Classification Search .............. 419/61, 419/30; 75/246; 438/652; 148/403
See application file for complete search history.

(56) References Cited

U.S. PATENT DOCUMENTS 4,992,095 A * 2/1991 Nate et al. ....................... 75/246
5,785,828 A   7/1998 Yamada et al.
(Continued)

FOREIGN PATENT DOCUMENTS

JP  62-070550 A  4/1987
JP  05-017868    1/1993
(Continued)

OTHER PUBLICATIONS

Mathaudhu et al. "Progress in Consolidation of Amorphous Zr-based Powder into Bulk Metallic Glass"; 2002 Fall Proceedings; Symposium CC: Supercooled Liquids, Glass Transition, and Bulk Metallic Glasses; Material Research Society Symposium Proceedings, vol. 754 @ 2003; pp. CC3.5.1-CC3.5.8.*

(Continued)

*Primary Examiner* — Weiping Zhu
(74) *Attorney, Agent, or Firm* — Howson & Howson LLP

(57) ABSTRACT

A sintered sputtering target having a structure where the average crystallize size is 1 nm to 50 nm and preferably comprises an alloy having a three-component system or greater containing, as its primary component, at least one element selected from among Zr, Pd, Cu, Co, Fe, Ti, Mg, Sr, Y, Nb, Mo, Tc, Ru, Rh, Ag, Cd, In, Sn, Sb, Te and a rare earth metal. This target is manufactured by sintering atomized powder. Thereby provided is a high density target having an extremely fine and uniform structure manufactured with the sintering method, in place of a conventional bulk metal glass produced by the quenching of a molten metal, which has a coarse crystal structure and requires a high cost for its production.

17 Claims, 4 Drawing Sheets

U.S. PATENT DOCUMENTS

| | | | |
|---|---|---|---|
| 5,882,493 A | 3/1999 | Iwasaki et al. | |
| 6,096,640 A * | 8/2000 | Hu | 438/652 |
| 6,127,016 A | 10/2000 | Yamada et al. | |
| 6,280,684 B1 | 8/2001 | Yamada et al. | |
| 6,503,592 B1 | 1/2003 | Yamada et al. | |
| 2003/0008168 A1 | 1/2003 | Shibuya et al. | |
| 2003/0126804 A1* | 7/2003 | Rosenflanz et al. | 51/307 |

FOREIGN PATENT DOCUMENTS

| | | |
|---|---|---|
| JP | 2000-144380 | 5/2000 |
| JP | 2000-207725 | 7/2000 |
| JP | 2002-069550 | 3/2002 |
| JP | 2002-212716 | 7/2002 |
| JP | 2002-363615 | 12/2002 |

OTHER PUBLICATIONS

Gu et al. "Structure of Shear Bands in Zirconium-Based Metallic Glasses Observed by Transmission Electron Microscopy"; 2002 Fall Proceedings; Symposium CC: Supercooled Liquids, Glass Transition, and Bulk Metallic Glasses; Material Research Society Symposium Proceedings, vol. 754 @ 2003; pp. CC7.9.1-CC7.9.6.*

Fan et al., "Deformation Behavior of Zr-Based Bulk Nanocrystalline Amorphous Alloys", Physical Review B, vol. 61, No. 6, R3761-R3763, Feb. 1, 2000—II.*

Kakiuchi et al. ("Application of Zr-Based Bulk Glassy Alloys to Golf Clubs", Materials Transactions, vol. 4, No. 4 (2001) pp. 678 to 681).*

* cited by examiner

100 μm

SPUTTERING TARGET AND METHOD FOR PRODUCTION THEREOF

BACKGROUND OF THE INVENTION

The present invention pertains to a sputtering target having a uniform and ultrafine structure and capable of suppressing the generation of particles and obtaining a thin film with favorable uniformity, and to the manufacturing method of such a sputtering target.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the field of nanotechnology, a sputtering target suitable for forming films of complex shapes is in demand.

Deposition technology is mainly used in the foregoing nanotechnology, and, since even the grain boundary of the formed film will become a problem in nanoprocessing, a deposition method enabling the formation of a film without a grain boundary; that is, an amorphous film or a film equivalent thereto is being sought upon forming a thin film.

Although the sputtering method is superior as a deposition method, since the target composition, structure, property and so on will be directly reflected on the quality of the thin film, a metallic glass target material capable of easily forming an amorphous film or a film equivalent thereto is being sought.

Conventionally, as methods of manufacturing a bulk-shaped metallic glass, proposed is a water quenching method of rapidly cooling the molten metal sealed in a silica tube and obtaining a bar-shaped metallic glass; a method of using a water-cooled copper mold and performing arc welding and quenching; a mold clamping casting method of melting metal on a copper mold, pressing this with a platen, and rapidly cooling this to obtain a metallic glass; a method of performing injection molding at a high pressure and rapidly cooling this with a copper mold; and a method of solidifying molten metal on a rotating disk to manufacture a metallic glass wire rod (for instance, refer to Functional Materials "Manufacturing Method of Bulk Metallic Glass", June 2002 Issue, Vol. 22, No. 6, pages 26 to 31).

Nevertheless, the foregoing manufacturing methods are manufacturing methods to be performed from molten metal, and are subject to quenching. Thus, it is necessary to equip the device with a function to match such quenching conditions, and there is a drawback in that this incurs extremely high costs. Further, the manufacturable shape is also limited, and there is a problem in that only a target of several cm$\phi$ can be manufactured.

SUMMARY OF THE INVENTION

An object of the present invention is to provide a high quality target material of a practical size in which the crystal structure is extremely fine and uniform, and which does not cause any problems of defects resulting from the generation of particles or unevenness in the composition, by employing, for instance, the powder metallurgy process, in place of a conventional bulk metal glass produced by the quenching of molten metal, which has a coarse crystal structure and requires a high cost for its production, for the coating film to be used in nanoprocessing.

The present invention provides:

1. A sputtering target having a structure where the average crystallite size is 1 nm to 50 nm;
2. A sputtering target having a structure where the average crystallite size is 1 nm to 5 nm;
3. A sputtering target having a structure where the average crystallite size is 1 nm to 2 nm;
4. The sputtering target according to any one of paragraphs 1 to 3 above, comprising an alloy having a three-component system or greater;
5. The sputtering target according to any one of paragraphs 1 to 4 above, containing at least one element selected from among Zr, Pt, Pd, Fe, Co and Cu as its primary component in an atomic ratio of 50 at % or more;
6. The sputtering target according to any one of paragraphs 1 to 5 above, comprising the requirements of a metallic glass satisfying a three-component system, atomic radius difference of 12% or more and negative heat of mixing;
7. The sputtering target according to any one of paragraphs 1 to 6 above, comprising an alloy having a three-component system or greater with Zr as its primary component, and further containing at least one or more elements selected from among Cu, Ni and Al;
8. The sputtering target according to any one of paragraphs 1 to 6 above, comprising an alloy having a three-component system or greater with Pt as its primary component, and further containing at least one or more elements selected from among Pd, Cu and P;
9. The sputtering target according to any one of paragraphs 1 to 6 above, comprising an alloy having a three-component system or greater with Pd as its primary component, and further containing at least one or more elements selected from among Cu, Ni and P;
10. The sputtering target according to any one of paragraphs 1 to 6 above, comprising an alloy having a three-component system with Fe as its primary component, and further containing B and at least one component selected from among Ti, V, Cr, Zr, Nb, Mo, Hf, Ta and W;
11. The sputtering target according to any one of paragraphs 1 to 6 above, comprising an alloy having a three-component system with Co as its primary component, and further containing at least one or more elements selected from among Fe, Ta and B;
12. The sputtering target according to any one of paragraphs 1 to 6 above, comprising an alloy having a three-component system with Cu as its primary component, and further containing at least one or more elements selected from between Zr and Ti; and
13. A manufacturing method of the sputtering target according to any one of paragraphs 1 to 12 above, wherein said sputtering target is manufactured by sintering gas atomized powder.

The present invention relates to a high density target having a uniform structure manufactured with the sintering method, in place of a conventional bulk metal glass produced by the quenching of a molten metal, which has a coarse crystal structure and requires a high cost for its production. When sputtering is performed with this target, a superior effect is yielded in that the target surface after sputtering will become a smooth erosion face, uniformity of the film will become favorable, and the generation of arcings and particles will hardly occur.

DETAILED DESCRIPTION OF THE INVENTION

Figure 1:
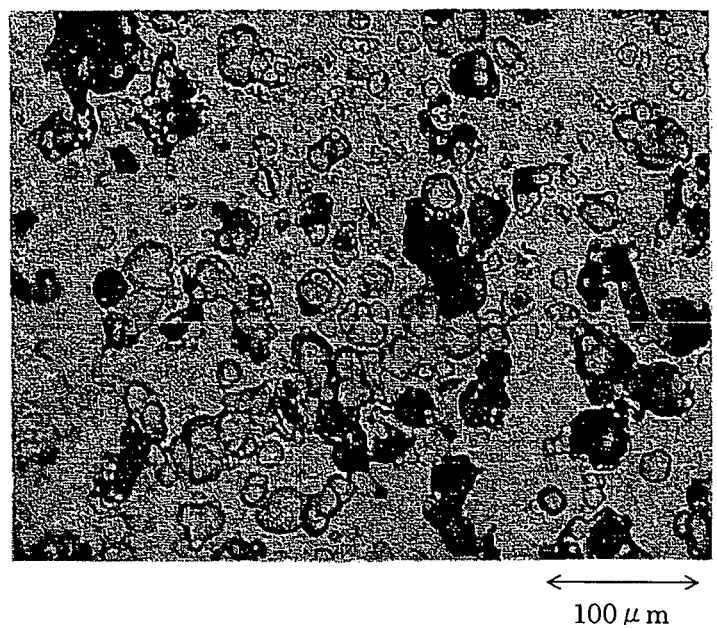
FIG. 1 is a structure observation photograph of the target of Example 1.

The sputtering target of the present invention has a structure where the average crystallite size is 1 nm to 50 nm, preferably 1 nm to 5 nm, and more preferably 1 nm to 2 nm.

If the crystal grain size of the target itself is narrow, the roughness of the sputtered and eroded surface will become smooth, and an effect is yielded in that the generation of particles, which aggravates the yield of products, can be suppressed.

In particular, an amorphous state is the ultimate structural form for reducing particles. Further, the realization of an amorphous or ultrafine structure will improve the composition and uniformity of the target structure, and products using this target will not encounter problems such as unevenness in the composition.

The target of the present invention comprises an alloy having a three-component system or greater with at least one element selected from among Zr, Pd, Cu, Co, Fe, Ti, Mg, Sr, Y, Nb, Mo, Tc, Ru, Rh, Ag, Cd, In, Sn, Sb, Te and rare-earth metal as its primary component.

These elements may be suitably selected depending on the use as a ferromagnetic thin film, high mechanical intensity thin film, high corrosion resistance thin film, high electrical conducting property and so on. Further, it is desirable that the atomic ratio of the primary component is 50 at % or more in order to exhibit these various properties.

More preferably, the elements other than the primary component possess the requirements to become a metallic glass; that is, they have a significant dimensional difference of 12% or more in relation to the atomic radius of elements of other components, and the alloy system obtained by the alloy system satisfying the negative heat of mixing is ensured to have a stable amorphous state forming ability.

Further, in order to secure the amorphous state forming ability, it is desirable that the element of the second component (component having the second largest atomic ratio) among the three-component system exists in an atomic ratio of 5 at % or more.

When Zr is to be used as the primary component, preferably Zr is contained at 50 at % or more, and the other constituent elements respectively contain one or more components from among Cu, Ni, Ti, V, Cr, Mn, Fe, Co, Zn, Ga, Ge, As, Se and Al, Si, P, S, B, C, N for satisfying the requirements of forming metallic glass.

As a representative example of this metallic glass target, there is Zr65-Cu17.5-Ni10-Al7.5 (atomic ratio).

When Pt is to be used as the primary component, preferably Pt is contained at 50 at % or more, and the other constituent elements respectively contain one or more components from among Pd, Cu, Ni, Ti, V, Cr, Mn, Fe, Co, Zn, Ga, Ge, As, Se and Al, Si, P, S, B, C, N for satisfying the requirements of forming metallic glass.

As a representative example of this metallic glass target, there is Pt50-Pd10-Cu18-P22 (atomic ratio).

When Pd is to be used as the primary component, preferably Pd is contained at 50 at % or more, and the other constituent elements respectively contain one or more components from among Cu, Ni, Ti, V, Cr, Mn, Fe, Co, Zn, Ga, Ge, As, Se and Al, Si, P, S, B, C, N for satisfying the requirements of forming metallic glass.

As a representative example of this metallic glass target, there is Pd78-Cu6-Si16 (atomic ratio).

When Fe is to be used as the primary component, preferably Fe is contained at 50 at % or more, and the other constituent elements respectively contain one or more components from among Ti, V, Cr, Zr, Nb, Mo, Tc, Ru, Rh, Pd, Ag, Cd, In, Sn, Sb, Te, Hf, Ta, W and Al, Si, P, S, B, C, N for satisfying the requirements of forming metallic glass.

As a representative example of this metallic glass target, there is Fe70-Zr10-B20 (atomic ratio).

When Co is to be used as the primary component, preferably Co is contained at 50 at % or more, and the other constituent elements respectively contain one or more components from among Cu, Ni, Ti, V, Cr, Mn, Fe, Zn, Ga, Ge, As, Se and Al, Si, P, S, B, C, N for satisfying the requirements of forming metallic glass.

As a representative example of this metallic glass target, there is Co72.5-Al12.5-B15 (atomic ratio).

When Cu is to be used as the primary component, preferably Cu is contained at 50 at % or more, and the other constituent elements respectively contain one or more components from among Ti, V, Cr, Zr, Nb, Mo, Tc, Ru, Rh, Pd, Ag, Cd, In, Sn, Sb, Te, Hf, Ta, W and Al, Si, P, S, B, C, N for satisfying the requirements of forming metallic glass.

As a representative example of this metallic glass target, there is Cu60-Zr30-Ti10 (atomic ratio).

With the sputtering target of the present invention, the raw materials of the foregoing components are melted (alloyed), for instance, via ampoule melting, arc welding or radio frequency melting, the obtained alloy is remelted, and, in certain cases, the foregoing raw material melting process is used as is to prepare alloy powder with an atomization method such as the gas atomization method, water atomization method or oil atomization method.

This alloy powder is subject to hot pressing or spark plasma sintering (SPS) to manufacture a target.

Upon preparing gas atomized powder, for example, argon gas is used as the sprayed gas, and this is discharged from a 0.8 mm φ quartz nozzle. The atomization gas pressure, for instance, is 80 kgf/cm$^2$, and the molten metal gas pressure is 0.3 kgf/cm$^2$. Further, as the sintering (spark plasma sintering method: SPS) conditions, sintering is performed at a pressing pressure of 600 MPa and a temperature below the crystallization temperature (conditions are changed according to the composition).

It is desirable that the diameter of the atomized powder is 1 nm or more and 50 μm or less. It is because when the atomized powder is coarse; that is, when the diameter thereof exceeds 50 μm, the crystallite size tends to become large. Meanwhile, if the atomized powder is less than 1 nm, the crystallite size will become too small, and this is not realistic in gas atomization since the powder will not be such a fine powder. Incidentally, the foregoing gas atomization conditions and sintering conditions may be arbitrarily changed according to the material, and are not necessarily limited to the foregoing conditions.

Upon setting the sintering conditions, it is desirable that sintering be generally performed between the crystallization temperature and the glass transition point temperature, and, if the sintering density rises to a level with no practicable problems (relative density of 90% or more), it is desirable to performed sintering near the glass transition point temperature. If the relative density is less than 90%, the surface after sputtering tends to become coarse. Further, it is desirable that the heating time during sintering be as short as possible in order to maintain the glass state.

The sintered body prepared as above is processed into a prescribed shape (surface processing such as machinery processing or polishing) in order to obtain a target. The obtained sputtering target of the present invention had a nano-size ultrafine, uniform structure. Further, the target of the present invention is characterized in that a target of 100 mm φ or more can be manufactured easily.

When sputtering is performed with this target, a superior effect is yielded in that the uniformity of the film will become favorable, generation of arcings and particles can be suppressed, and quality of the sputtering deposition can be improved.

The sputtering target of the present invention is not limited to the deposition in nanotechnology, and may also be used in a standard amorphous thin film or crystalline thin film as a matter of course.

EXAMPLES

The present invention is now explained in detail with reference to the Examples and Comparative Examples. These Examples are merely illustrative, and the present invention shall in no way be limited thereby. In other words, the present invention shall only be limited by the scope of the present invention, and shall include the various modifications other than the Examples of this invention.

Example 1

A Zr65-Cu17.5-Ni10-Al7.5 (atomic ratio) alloy was melted, and this molten metal was discharged from a 0.8 mm φ quartz nozzle with argon gas as the injection gas to prepare atomized powder. Here, the atomization gas pressure was 80 kgf/cm$^2$, and the molten metal gas pressure was 0.3 kgf/cm$^2$.

Next, this atomized powder was sintered with the spark plasma sintering method (SPS method) under the conditions of 410° C., which is a temperature near crystallization, and 600 MPa, and a 216 mmφ, 8.4 mmt sintered body was obtained thereby. The sintered body had a density of 6.70 g/cm$^3$ (according to the Archimedes method), and was of the density 6.716 g/cm$^3$ of a dissolved product. Therefore, the relative density was 99.8%, and the sintered body densified.

The structure observation photograph of this target is shown in FIG. 1. In FIG. 1, a grain boundary is not observed (amorphous state), and the atomized powder is pressed as is and became a bulk body.

In order to confirm the amorphous state of the plasma sintered body, a sample was observed with the X-ray diffraction method. The half-power band width was 6.18° and the average crystallite size calculated with the Scherrer formula was 14 Å (1.4 nm), and it has been confirmed that the amorphous state was maintained even after the SPS processing without any crystal growth.

Figure 2:
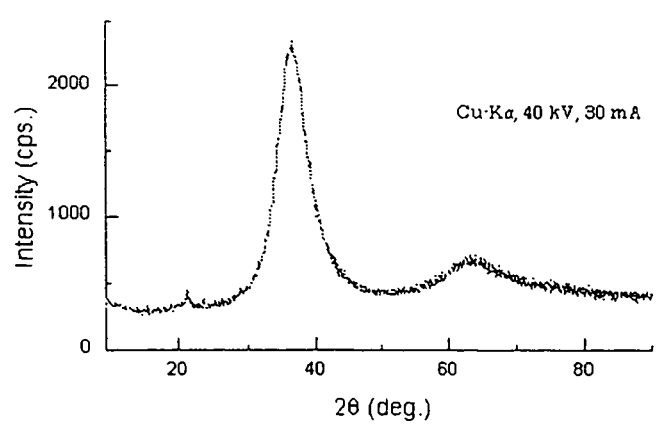
FIG. 2 is an XRD profile of the target of Example 1.

This XRD profile is shown in FIG. 2. Incidentally, in the mother alloy before being subject to atomization, crystallization had occurred, and a two-phase lamellar structure was observed in the grains.

Next, sputtering was performed with this target under the conditions of 10 mTorr, in pure Ar, and 300 W. As a result, a nano-crystal structure film having a crystallite size of 14 Å was formed. Further, uniformity of the film was favorable, and there was hardly any generation of arcings and particles.

Figure 3:
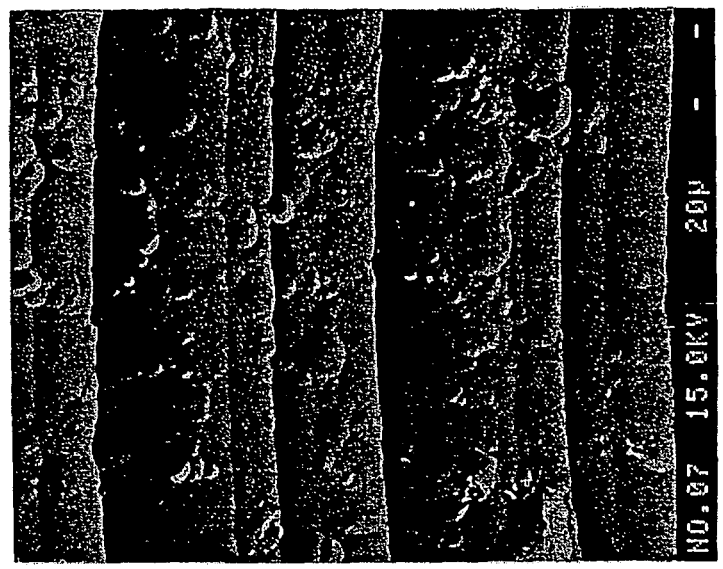
FIG. 3 is an SEM image of the target erosion face after sputtering of Example 1.
Figure 4:
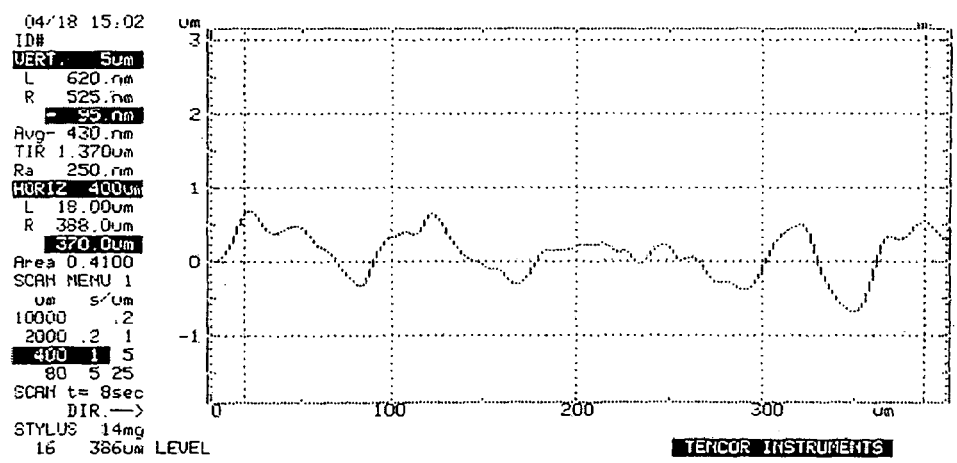
FIG. 4 is a diagram showing the results upon measuring the surface roughness of the erosion face of the target of Example 1.

As a result of observing the target surface after sputtering, as shown in FIG. 3 (SEM image of the erosion face), a smooth erosion face was obtained. Incidentally, the vertical line in FIG. 3 is the trace of the lathe turning machine. FIG. 4 shows the result upon measuring the surface roughness of the erosion face. The target surface roughness after sputtering was 0.25 μm.

Comparative Example 1

A Zr65-Cu17.5-Ni10-Al7.5 (atomic ratio) material having the same composition as Example 1 was subject to arc welding to form an ingot, and this was further subject to a lathe process to form a target. The density of the target was 6.716 g/cm$^3$.

Figure 5:
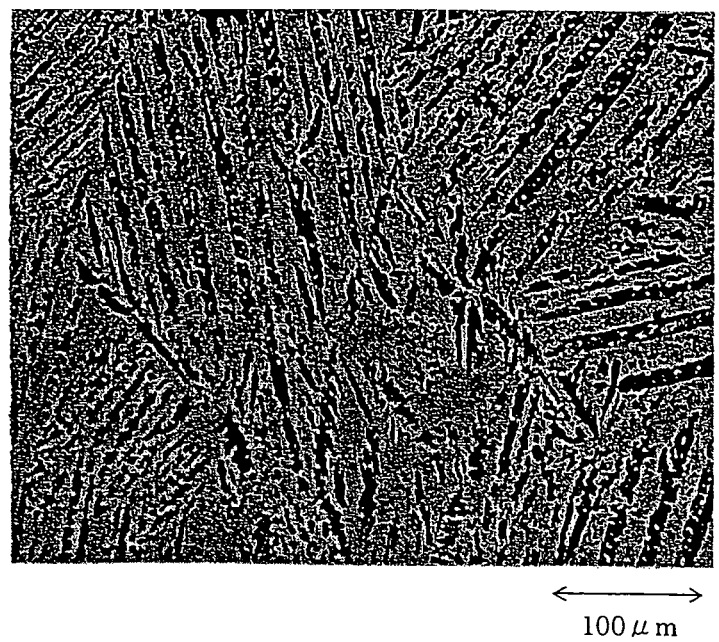
FIG. 5 is a structure observation photograph of the target of Comparative Example 1.
Figure 6:
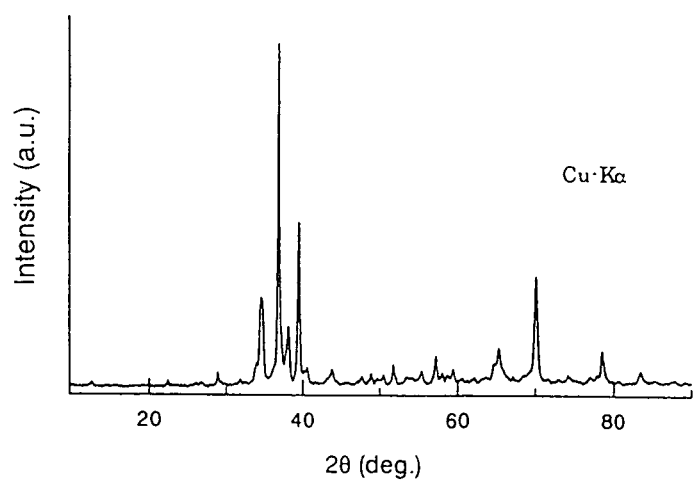
FIG. 6 is an XRD profile of the target of Comparative Example 1.

The structure observation photograph of this target is shown in FIG. 5. In FIG. 5, a structure having a two-phase lamellar (eutectic) structure was observed. This XRD profile is shown in FIG. 6.

Next, sputtering was performed with this target under the conditions of 10 mTorr, in pure Ar, and 300 W. As a result, uniformity of the film was inferior and the generation of arcings and particles was observed.

Figure 7:
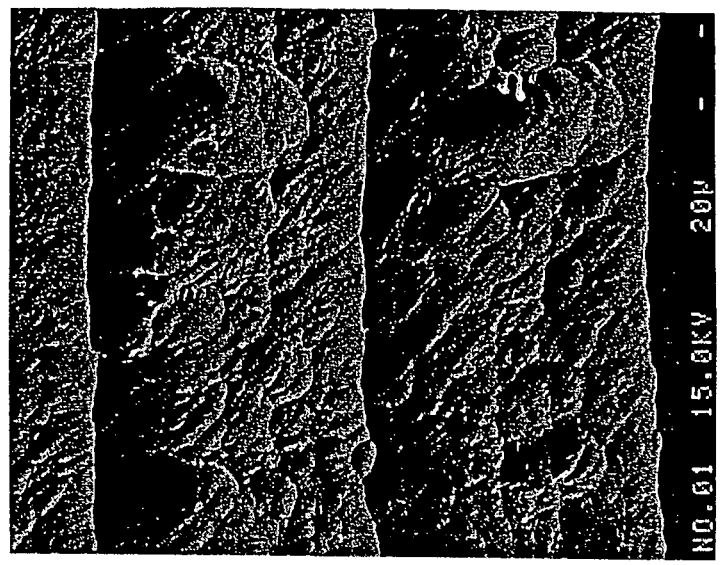
FIG. 7 is an SEM image of the target erosion face after sputtering of Comparative Example 1.
Figure 8:
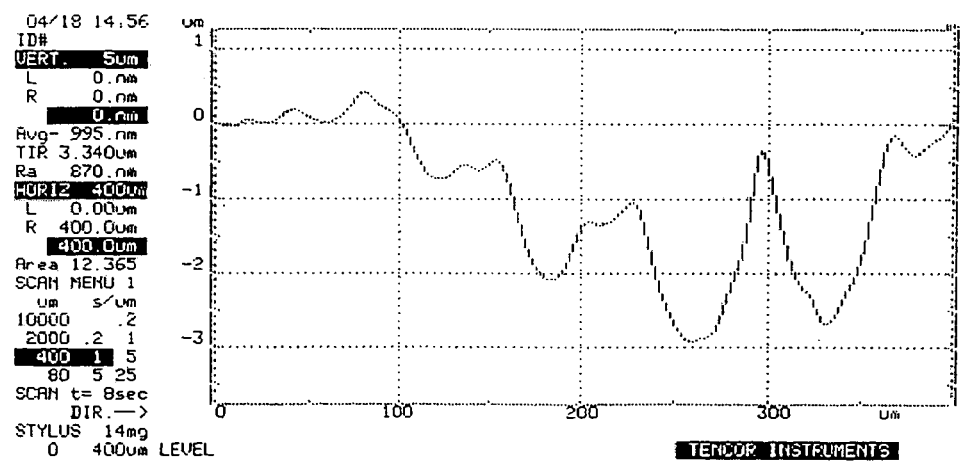
FIG. 8 is a diagram showing the results upon measuring the surface roughness of the erosion face of the target of Comparative Example 1.

As a result of observing the target surface after sputtering, as shown in FIG. 7 (SEM image of the erosion face), an erosion face with large irregularities was obtained. Incidentally, the vertical line in FIG. 7 is the trace of the lathe turning machine. FIG. 8 shows the result upon measuring the surface roughness of the erosion face. The target surface roughness after sputtering was 0.87 μm, which is a value that is 3.5 times greater than an amorphous product.

Accordingly, it is evident that the dissolved product (crystalline) and the amorphous material (Example 1) of the present invention have significant differences in the characteristics as a target.

Examples 2 to 6

Next, the various compositions were changed within the scope of the present invention to prepare atomized powder under the same conditions as Example 1, and this was sintered to obtain a target. The manufacturing conditions and crystal condition, average crystallite size, and target surface roughness after sputtering are shown in Table 1. Incidentally, Table 1 shows the conditions and results of Example 1 and Comparative Example 1 so that they can be compared.

Next, sputtering was performed with this target under the conditions of 10 mTorr, in pure Ar, and 300 W. As a result, as with Example 1, uniformity of the film was favorable, and there was hardly any generation of arcings and particles.

As a result of observing the target surface after sputtering, a smooth erosion face was obtained as with the case of FIG. 3. As a result of measuring the surface roughness of the erosion face, as shown in Table 1, surface roughness in each case was small.

Comparative Examples 2 to 14

Next, Comparative Examples 2 to 14 in which the various compositions were changed outside the scope of the present invention are shown. The target was prepared via sintering. The manufacturing conditions and crystal condition, average crystallite size, and target surface roughness after sputtering are similarly shown in Table 1.

Comparative Example 2 is atomized powder as with Example 1, but the crystallite size is 80 nm. Here, the target surface roughness after sputtering was 1.42 μm, uniformity of the film was inferior and the generation of arcings and particles was observed.

Comparative Examples 3 to 7 are a two-component system, and Comparative Examples 8 to 12 are a three-component system. Each of these is a crystalline target.

As a result of performing sputtering with the target of Comparative Examples 2 to 12 under the conditions of 10 mTorr, in pure Ar, and 300 W, a macro pattern film was formed in each case, and uniformity of the film was inferior and the generation of arcings and particles was observed. As a result of observing the target surface after sputtering, an erosion face with large irregularities was obtained as with the case in FIG. 7.

Although Comparative Example 13 has the same composition as Example 1, since the SPS sintering temperature was low (350° C.), sintering was insufficient, and the relative density fell to 88.4%. This kind of low density target is unfavorable since it will affect the uniformity of deposition.

Comparative Example 14 is a case where coarse powder; that is, atomized powder having a diameter of 103 μm, was used. This case is unfavorable since the target surface after sputtering became coarse, and the uniformity of the film was also inferior.

Manufacturing method of Examples and Comparative Examples: Atomized powder was subject to SPS; provided, however, that with Comparative Example 1, atomized powder was subject to arc melting, and, with Comparative Example 2, atomized powder was subject to SPS and thereafter subject to annealing.

Surface roughness: Roughness of target surface after sputtering.

The present invention relates to a high density target having an even structure manufactured with the sintering method. When sputtering is performed with this target, a superior effect is yielded in that the target surface after sputtering will become a smooth erosion face, uniformity of the film will become favorable, and the generation of arcings and particles will hardly occur. Thus, this target is particularly useful in forming a coating film for nanoprocessing.

The invention claimed is:

1. A metallic glass sputtering target comprising:
   a sintered body target structure having a diameter of 100 mm or more and an ultrafine and uniform structure with an average crystallite size of 1 nm to 5 nm, said average crystallite size of 1 nm to 5 nm being uniform entirely throughout said sputtering target, and said target structure being of an amorphous state in which a grain boundary is not observable and being without any crystal growth;
   said sputtering target being made of an alloy having a three or more component system containing at least one element selected from the group consisting of Zr, Pt, Pd, Fe, Co, and Cu as its primary component in an atomic ratio

TABLE 1

| | Composition | Size of Atomized Powder μm | SPS Temperature ° C. | Relative Density % | Crystal Condition | Average Crystallite Size nm | Surface Roughness μm |
|---|---|---|---|---|---|---|---|
| Example 1 | Zr65Al7.5Ni10Cu17.5 | 39 | 410 | 98.2 | Amorphous | 1.4 | 0.25 |
| Example 2 | Pd78Cu6Si16 | 45 | 400 | 97 | Amorphous | 0.8 | 0.12 |
| Example 3 | Cu60Zr30Ti10 | 34 | 480 | 98.3 | Amorphous | 1.2 | 0.34 |
| Example 4 | Co72.5Al12.5B15 | 40 | 520 | 96.4 | Amorphous | 1.8 | 0.20 |
| Example 5 | Fe70Zr10B20 | 36 | 520 | 98.8 | Amorphous | 2 | 0.18 |
| Example 6 | Pd50Cu15Si35 | 42 | 400 | 97.4 | Amorphous | 1.7 | 0.12 |
| Comparative Example 1 | Zr65Al7.5Ni10Cu17.5 | — | — | 99.8 | Crystalline | 35 | 0.87 |
| Comparative Example 2 | Zr65Al7.5Ni10Cu17.5 | 39 | 410 | 98.2 | Crystalline | 80 | 1.42 |
| Comparative Example 3 | Zr65Cu35 | 45 | 520 | 95.5 | Crystalline | 35 | 1.10 |
| Comparative Example 4 | Pd78Si22 | 43 | 500 | 96.2 | Crystalline | 85 | 2.51 |
| Comparative Example 5 | Cu60Ti40 | 58 | 530 | 95.1 | Crystalline | 14 | 3.42 |
| Comparative Example 6 | Co72.5Al27.5 | 44 | 500 | 97.5 | Crystalline | 26 | 1.23 |
| Comparative Example 7 | Fe70Zr30 | 36 | 550 | 93.2 | Crystalline | 23 | 2.19 |
| Comparative Example 8 | Zr34Al30Ni30Cu6 | 39 | 530 | 97.5 | Crystalline | 35 | 2.51 |
| Comparative Example 9 | Pd34Cu33Si33 | 35 | 500 | 96.4 | Crystalline | 8.5 | 3.42 |
| Comparative Example 10 | Cu34Zr33Tl33 | 43 | 550 | 98.8 | Crystalline | 1.40 | 1.23 |
| Comparative Example 11 | Co34Al33B33 | 43 | 550 | 97.9 | Crystalline | 26 | 2.19 |
| Comparative Example 12 | Fe34Zr33B33 | 39 | 550 | 95.6 | Crystalline | 23 | 2.19 |
| Comparative Example 13 | Zr65Al7.5Ni10Cu17.5 | 39 | 350 | 88.4 | Amorphous | 3.4 | 1.26 |
| Comparative Example 14 | Zr65Al7.5Ni10Cu17.6 | 103 | 410 | 98.4 | Crystalline | 100 | 3.52 | of 50 at % or more, said alloy satisfying the requirements of metallic glass formation having an atomic radius difference of 12% or more and negative heat of mixing of constituent elements;

said sputtering target having a relative density of at least 96.4%; and said sintered body target structure being made of sintered gas atomized powder such that said sintered body target structure has powder grains that form said sintered body target structure.

2. A sputtering target according to claim 1, wherein said average crystallite size of said target structure is 1 nm to 2 nm.

3. A sputtering target according to claim 2, wherein said primary component of said alloy is Zr, and wherein said alloy contains at least one element selected from the group consisting of Cu, Ni and Al.

4. A sputtering target according to claim 1, wherein said primary component of said alloy is Zr, and wherein said alloy contains at least one element selected from the group consisting of Cu, Ni and Al.

5. A sputtering target according to claim 1, wherein said primary component of said alloy is Pt, and wherein said alloy contains at least one element selected from a group consisting of Pd, Cu and P.

6. A sputtering target according to claim 1, wherein said primary component of said alloy is Pd, and wherein said alloy contains at least one element selected from a group consisting of Cu, Ni and P.

7. A sputtering target according to claim 1, wherein said primary component of said alloy is Fe, and wherein said alloy contains B and at least one element selected from a group consisting of Ti, V, Cr, Zr, Nb, Mo, Hf, Ta and W.

8. A sputtering target according to claim 1, wherein said primary component of said alloy is Co, and wherein said alloy contains at least one element selected from a group consisting of Fe, Ta and B.

9. A sputtering target according to claim 1, wherein said primary component of said alloy is Cu, and wherein said alloy contains at least one element selected from a group consisting of Zr and Ti.

10. A metallic glass sputtering target comprising:

a sintered body target structure having a diameter of 100 mm or more and an ultrafine and uniform structure with an average crystallite size of 1 nm to 5 nm, said average crystallite size of 1 nm to 5 nm being uniform entirely throughout said sputtering target, and said target structure being of an amorphous state in which a grain boundary is not observable and being without any crystal growth;

said sputtering target being made of an alloy having a three or more component system containing Zr as its primary component in an atomic ratio of 50 at % or more, said alloy containing at least one element selected from the group consisting of Cu, Ni and Al, and said alloy possessing the requirements of a metallic glass satisfying an atomic radius difference of 12% or more and negative heat of mixing; and said sputtering target having a relative density of at least 96.4%; and said sintered body target structure being made of sintered gas atomized powder such that said sintered body target structure has powder grains that form a constituent unit of said sintered body target structure.

11. A metallic glass sputtering target according to claim 10, wherein said average crystallite size uniform entirely throughout said sputtering target is 1 nm to 2 nm.

12. A metallic glass sputtering target according to claim 10, wherein said alloy consists of Zr, Cu, Ni and Al.

13. A metallic glass sputtering target according to claim 10, wherein said alloy of said sputtering target is $Zr_{65}Cu_{17.5}Ni_{10}Al_{7.5}$ and said target has a relative density of 99.8%.

14. A metallic glass sputtering target according to claim 10, wherein said three or more component system contains Zr in an atomic ratio of 65 at %.

15. A metallic glass sputtering target according to claim 10, wherein said at least one element selected from the group consisting of Cu, Ni and Al exists in an atomic ratio of 5 at % or more.

16. A metallic glass sputtering target according to claim 10, wherein said sintered body target structure is a structure having been sintered at a sintering temperature of between 400 and 520° C.

17. A metallic glass sputtering target according to claim 10, wherein said sintered body target structure has an erosion face that has a surface roughness capable of remaining between 0.12 to 0.34 μm after sputtering is performed with the target structure.

* * * * *